(12) United States Patent
Gotoh et al.

(10) Patent No.: US 7,345,419 B2
(45) Date of Patent: Mar. 18, 2008

(54) SUBSTRATE FOR OPTICAL ELEMENT, ORGANIC ELECTROLUMINESCENCE ELEMENT AND ORGANIC ELECTROLUMINESCENCE DISPLAY DEVICE

(75) Inventors: Tomohisa Gotoh, Tokyo (JP); Satoru Toguchi, Tokyo (JP); Atsushi Kamijo, Tokyo (JP); Yasuharu Onishi, Tokyo (JP); Hitoshi Ishikawa, Tokyo (JP); Junichi Yamanari, Kanagawa (JP)

(73) Assignee: Samsung SDI Co., Ltd., Suwon (KR)

( * ) Notice: Subject to any disclaimer, the term of this patent is extended or adjusted under 35 U.S.C. 154(b) by 124 days.

(21) Appl. No.: 10/900,274

(22) Filed: Jul. 28, 2004

(65) Prior Publication Data

US 2005/0023967 A1    Feb. 3, 2005

(30) Foreign Application Priority Data

Jul. 29, 2003    (JP) .............................. 2003-282202

(51) Int. Cl.
*H01J 1/62* (2006.01)
*H01J 63/04* (2006.01)

(52) U.S. Cl. ...................... 313/504; 313/498; 313/512

(58) Field of Classification Search ................ 313/498, 313/504, 506, 512; 257/40, 98
See application file for complete search history.

(56) References Cited

U.S. PATENT DOCUMENTS 6,787,796 B2 * 9/2004 Do et al. ...................... 257/40

6,900,457 B2 * 5/2005 Toguchi et al. ............... 257/40
6,954,031 B2 * 10/2005 Hashimoto et al. ......... 313/503

FOREIGN PATENT DOCUMENTS

| CN | 1592506 A | 3/2005 |
|---|---|---|
| EP | 0567995 | 11/1993 |
| EP | 1476002 | 11/2004 |
| JP | 58-106590 | 6/1983 |
| JP | 2000-182781 | 6/2000 |
| JP | 2002-196143 | 7/2002 |
| JP | 2003-090916 | 3/2003 |

OTHER PUBLICATIONS

European Search Report dated Mar. 27, 2007.
The Chemical Society of Japan, "Hyojun Kagaku Yogo Jiten (Standard Dictionary of Chemical Terms)", 2nd Edition, Mar. 2005, Maruzen.
The Chemical Society of Japan, "Kagaku Binran, Kiso-hen (Handbook of Chemistry, Basic)", 5th Edition, Feb. 2004, Maruzen.

* cited by examiner

*Primary Examiner*—Kevin Quarterman
(74) *Attorney, Agent, or Firm*—H.C. Park & Associates, PLC

(57) ABSTRACT

The present invention uses a substrate for an optical element comprising a light scattering unit that scatters visible light, and a light transmissive opening that transmits the visible light in a light transparent substrate transmitting the visible light, as a light extraction substrate of the organic electroluminescence element. With this, a substrate for an optical element, an organic electroluminescence element, and an organic electroluminescence display device are provided that improves the light extraction efficiency to outside of the substrate and also improves the light extraction efficiency by obtaining a high luminance organic electroluminescence element.

10 Claims, 12 Drawing Sheets

SUBSTRATE FOR OPTICAL ELEMENT, ORGANIC ELECTROLUMINESCENCE ELEMENT AND ORGANIC ELECTROLUMINESCENCE DISPLAY DEVICE

CROSS-REFERENCE TO RELATED APPLICATION

This application claims the benefit of Japanese Patent Application No. 2003-282202, filed Jul. 29, 2003, the disclosure of which is hereby incorporated herein by reference in its entirety.

BACKGROUND OF THE INVENTION

1. Field of the Invention

The present invention relates to a substrate for an optical element that emits light of a specific wavelength range by current driving, optical element using the same and organic electroluminescence display device used as a display device.

2. Description of the Related Art

An organic electroluminescence (organic EL) device is an emissive device using a principle that a fluorescent material is emitted by recombination energy between holes injected from an anode and electrons injected from a cathode by applying the electric field. Since C. W. Tang, et al. reported a low voltage driven organic electroluminescence display with a stacked type device (C. W. Tang, S. A. VanSlyke, Applied Physics Letter, Vol. 51, p. 913, 1987), a research on the organic electroluminescence element made of organic material has widely conducted. Tang et al uses Tris(8-Qionolinol) Aluminum in an emission layer and triphenyldiamine derivatives in a hole transport layer.

Advantages of the stacked structure are to increase hole injection efficiency toward the emission layer, to block electrons injected from the cathode to increase formation efficiency of an exciton formed by recombination, and to isolate the exciton formed in the emission layer, etc.

As an organic electroluminescence element described above, a two-layer type having a hole transport (injection) layer and an electron transport emission layer, or a three-layer type having a hole transport (injection) layer, an emission layer, and an electron transport (injection) layer are widely known. For such a stacked type device, researches on structure and method of forming the device have been conducted in order to increase recombination efficiency between the injected hole and electron. However, the organic electroluminescence has a limit to the probability of forming a singlet due to dependency of spin statistics when recombining carriers, and thus having an upper limit in lumonous efficiency. This upper limit value is about 25%.

Further, for a surface emitting device, such as an organic electroluminescence is element, light that has an exit angle over a critical angle is totally reflected due to a refractive index of a luminous body, so that it cannot be emitted outward. Thus, it is expected that if the refractive index of the luminous body is set to 1.6, only 20% of the total amount of luminescence will be available. Therefore, the limit of the energy conversion efficiency is about 5%, including the singlets formation probability, so that there cannot but be lower efficiency (cf. Tetsuo TSUTSUI, "Present status of research and development in organic electroluminescent devices": Monthly Display, Vol. 1, No. 3, p11, Sep. 9, 1995.). In an organic electroluminescence element having a strong limitation in luminous efficiency, light extraction efficiency undergoes fatal performance degradation.

A method of increasing this light extraction efficiency has been investigated with regard to a light-emitting device having a structure, such as a conventional inorganic electroluminescence element. For example, a method of increasing efficiency by comprising a light-focusing property in the substrate (Japanese Patent Application Laid-Open No. S63-314795), or a method of forming a reflective surface on a side of a device (Japanese Patent Application Laid-Open No. H01-220394) have been proposed. Further, introducing a flat layer that has an intermediate refractive index between a substrate glass and a luminous body to form an anti-reflection film (Japanese Patent Application Laid-Open No. S62-172691) was also proposed.

Further, Japanese Patent Application Laid-Open No. 2002-260844 discloses an organic electroluminescence element comprising a waveguide formed by a partition formed on a substrate adjacent to the pixel used herein, wherein the partition is formed of transparent polymer and white corpuscles, or this polymer and transparent corpuscles dispersed in the polymer, having a refractive index different from that of the polymer. (Referring to FIG. 2 and Claims of said application)

Further, Japanese Patent Application Laid-Open No. 2002-260866 discloses an organic electroluminescence element comprising an anode that injects a hole, an emission layer having a luminous zone, and an cathode that injects an electron, and wherein at least one of these electrodes is transmissive, and this transmissive electrode includes a means for changing an angle of light emitted from the emission layer therein (FIG. 1, Detailed Description of the Invention, Paragraph 0026: Claim 1.)

Further, Japanese Patent Application Laid-Open No. 2002-260845 discloses one or a plurality of organic electroluminescence elements having a substrate and a plurality of light converting means and formed directly on one surface of the substrate or over the sublayer, wherein each of the plurality of organic electroluminescence elements comprises a plurality of light angle changing means. This Laid-Open Publication described that the light angle changing means has a configuration such that the length direction of a shape of transparent material, opaque particles or air layers faces the thickness direction of the substrate. (Claim 8 in the above Publication)

The conventional method has the following problems. The method for increasing light extraction efficiency by making the substrate have a light-focusing property or the method of forming a reflective surface on a side of the device is effective for a device with a large luminous area, however, in a device with a small pixel area such as a dot matrix display, it is difficult to form a lens for light-focusing property or the reflective surface on a side, etc.,. Further, in the organic electroluminescence element, a film thickness of an emission layer is below several μm, so that it is difficult to perform taper turning to form a reflective mirror on a side of a device with the current processing technology for fine, thereby significantly increasing cost.

Meanwhile, a method of introducing the flat layer having an intermediate refractive index between a substrate glass and a luminous body to form an anti-reflection layer has an effect in improving light extraction efficiency, however, it is difficult to prevent total reflection with this method. Therefore, while the effect of increasing light extraction efficiency is valid for the inorganic electroluminescence having a large refractive index, it is not valid for the organic electroluminescence element having a small refractive index.

Further, transmission light toward a metal electrode (cathode) surface in the organic electroluminescence layer has great transmission loss due to the metal electrode. Thus, to effectively extract the transmission light, there is a need to place a partition in short interval. Therefore, the invention disclosed in Japanese Patent Application Laid-Open No. 2002-260844 reduces the luminous area of a device, thus it does not have such great improvement.

Further, in the invention disclosed in the Japanese Patent Application Laid-Open No. 2002-260866, the area where the electric field cannot be applied increases so that there is no great improvement just like the above invention.

Further, in the invention disclosed in the Japanese Patent Application Laid-Open No. 2002-260845, light having an exit angle over the critical angle cannot be effectively extracted. Further, while Japanese Patent Application Laid-Open No. 2002-260845 describes that the performance is improved when the light angle changing means are distributed all over the substrate (FIG. 10 and Paragraph 0032 in the Description corresponding to FIG. 10 in this publication), however, there is a problem that if a plurality of scatters exist in the thickness is direction, the substrate becomes white, thus reducing the color purity of the emitted light.

As described above, the light extraction of the organic electroluminescence is still insufficient.

SUMMARY OF THE INVENTION

The present invention is contrived to figure out how emitting light having an angle more than a critical angle and totally reflected at the air/glass interface can be effectively scattered to emit at an angle less than the critical angle.

The present invention provides an optical element substrate (light emitting device substrate) that improves light extraction efficiency of an organic electroluminescence element.

After reviewing the foregoing, the inventors found that light extraction efficiency is improved by using a substrate for an optical element comprising a light scattering unit that scatters visible light and a light transmissive opening that transmits the visible light in the light transparent substrate that transmits the visible light, as a light extraction substrate of an organic electroluminescence element. With this substrate for the optical element, a luminance of the organic electroluminescence element is increased.

In other words, the substrate for the optical element of the present invention is characterized in that it comprises a light scattering unit that scatters visible light and a light transmissive opening that transmits the visible light in the light transparent substrate that transmits the visible light, and in that a length L of the light scattering unit in the thickness direction of the substrate and a width W of the light transmissive opening are found by the following Eq. 1.

$$W/L \leq \tan(\arcsin(n1/n2)) \quad \text{(Eq. 1)}$$

where, n1 indicates a refraction index of air, and n2 indicates that of the light transparent substrate.

Specifically, it is preferable that one surface of the light scattering unit is the same as the surface of the light transparent substrate, and that the light transmissive opening, segmented by at least one light scattering unit, is formed in the light transparent substrate, and the light transmissive openings are periodically placed in a direction of substrate surface, and that the substrate for the optical element is to form at least one display pixel wherein the light scattering unit is extended in at least one direction in the display pixel.

Further, it is preferable that the light scattering unit is a wall structure that segments the display pixel, and that the light transmissive opening formed by being segmented by the wall structure is periodically placed in the direction of substrate surface, and that the width W of the light transmissive opening is more than 100 nm and less than 200 μm, and that the substrate for the optical element, in which the light transmissive openings are periodically placed in the direction of substrate surface, comprises a light scattering unit that scatters visible light and a light transmissive opening that transmits the visible light in one surface of the light transparent substrate that transmits the visible light, wherein the sum of the thickness of the segmented wall and the width of one adjacent light transmissive opening is more than 130 nm and less than 25 μm, and that the light transmissive opening is isolated in a direction of substrate surface in the pixel.

The organic electroluminescence element of the present invention comprises a substrate for an optical element of one of the above descriptions, at least an anode, an organic layer made of an emission layer, and a cathode.

The organic electroluminescence display device of the present invention comprises a plurality of the organic electroluminescence element.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
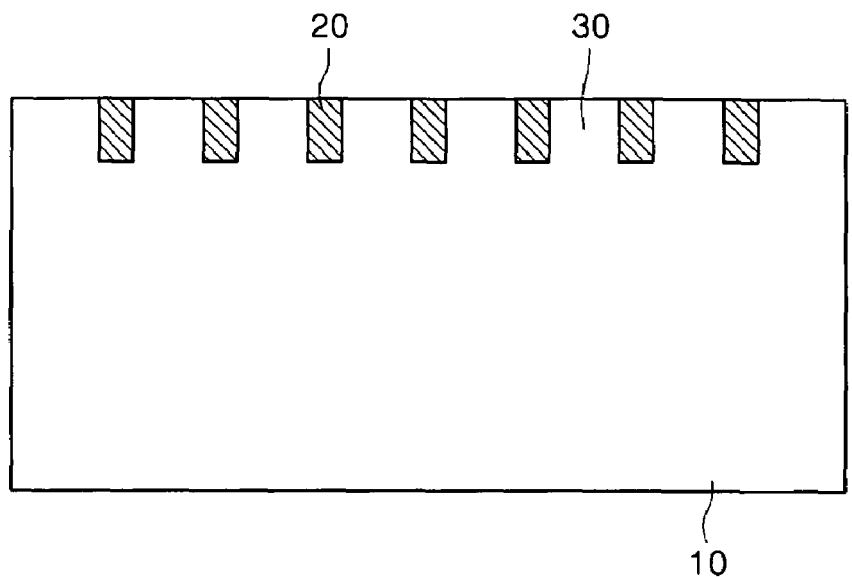
FIGS. 1 and 2 are schematic cross-sectional views of a substrate for an optical element of the present invention.
Figure 2:
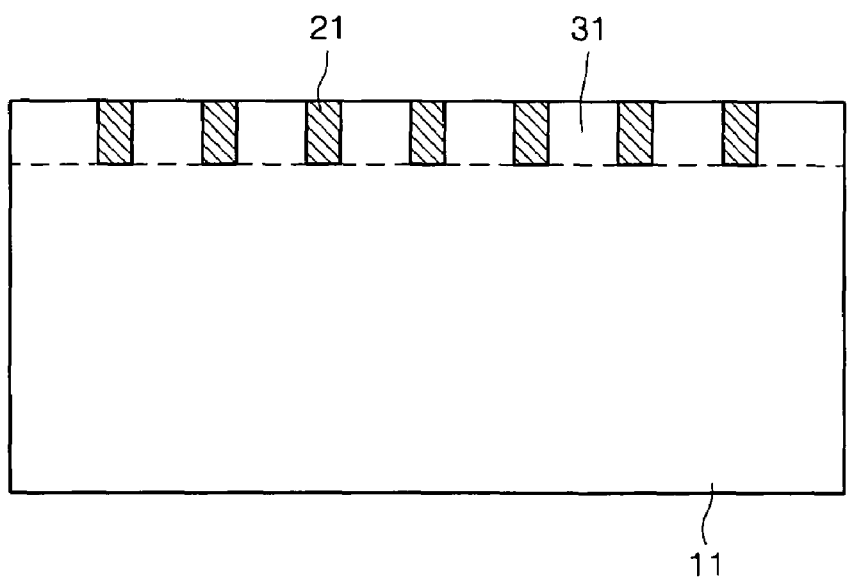

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a schematic cross-sectional view illustrating a substrate for an optical element of the present invention.

As shown in FIG. 1, the substrate for the optical element of the present invention comprises a light scattering unit 20 that scatters visible light and a light transmissive opening 30 that transmits the visible light, within a light transparent substrate 10 that transmits the visible light. Further, FIG. 1 shows a cross-sectional view cut in a direction perpendicular to the substrate surface. For the direction of the substrate surface, it is preferable that the substrate has the shape illustrated in FIGS. 3 to 7. Further, FIGS. 3 to 7 are just illustrations, and not limited to these shapes, thus the present invention can be formed such that each light scattering unit 22 to 26 or each light transmissive opening 32 to 36 are isolated in the direction of the substrate surface, Since the light transparent substrate 10 of the present invention serves as an optical element, it is necessary to be at least optically transparent when in use. That is, the light transparent substrate 10 of the present invention that transmits visible light can transmit at least some of the light whose wavelength is within 400 to 800 nm, and can be formed of either inorganic or organic material. For example, the inorganic material used for this substrate can be glass, and the organic material can be plastic, etc.

Preferable, the plastic described above can employ engineering plastic, such as Polyethersulfone (PES), Polyethylene Terephthalate (PET), or its derivates. Further, the substrate can employ a plurality of different materials, which can be either among inorganic materials, or among organic materials, or even a mixture between inorganic and organic materials. The substrate can also be formed in a film shape using one or a plurality of materials (a plurality of organic mixtures, inorganic mixtures, and organic and inorganic mixtures), and can also be formed by coating the fabricated film a plurality of times.

For the light transparent substrate 10 of the present invention, preferably, the light scattering unit 20 is isolated in the direction of the substrate surface, and more preferably, in the direction of one substrate surface (in the direction of one surface of the substrate) as illustrated in FIGS. 1, 2, 8, 9, 10, 17 and 18. That is, in the present invention, the light scattering units 20, 21, 27, 28, 29, 201, 202 are formed isolated or independently with the light transmissive openings 30, 31, 37, 38, 39, 301, 302. Further, it is preferable that the light scattering units 20, 21, 27, 28, 29, 201, 202 are formed with the optically same material as the substrates 10, 11, 12, 13, 14, 17, 18, where "optically same" means that light within a wavelength (or any wavelength) has the same refractive index.

The light scattering unit 20 of the present invention scatters at least some light having a wavelength of 400 to 800 nm. The light scattering unit 20 can be made of inorganic or organic material. Further, it can be made of one or a plurality of components. Further, the light transmissive opening 30 of the present invention indicates a transparent portion observed in the normal direction of the surface of the light transmissive substrate 10 (in the direction perpendicular to the screen when used as a display). As such, the substrate for the optical element of the present invention is not such a structure that the light scattering unit (the film, if the light scattering unit is formed in a film type) covers all over the substrate surface. For the substrate for the optical element, light from the electrode of the organic electroluminescence element transmitted in the horizontal direction (light that has a large component in the direction of substrate surface) is efficiently scattered, thus improving the luminance in the front direction of the substrate.

To describe the present invention in more detail, in the light transparent substrate of the present invention, the light scattering unit 20 and the light transmissive opening 30 are is placed (optically) alternatively in the direction of the substrate surface. That is, seen in the normal direction of the surface of the light transmissive substrate (in the direction perpendicular to the substrate surface), the light scattering unit 20 and the light transmissive opening 30 are placed alternatively in the direction of the substrate surface (in the direction of one side of the substrate surface).

Although the alternative placements do not necessarily need to be periodic, it is preferable that the light scattering unit 20 and the light transmissive opening 30 are periodically placed in the direction of the substrate surface, preferably, in the surface direction of one side of substrate surface (one side surface) due to the design or manufacture convenience. Such a period can be set arbitrarily, however, when the length is a reference, it is preferable that the sum 42 of the thickness of the segmented wall and the width of one adjacent light transmissive opening 30 is 130 nm to 25 μm.

Further, this period can be plural in the substrate surface. The period can vary according to a place, or according to a direction of the substrate surface. Further, the width of the light transmissive opening 30 is 100 μm to 20 μm, and preferably, 110 μm to 10 μm.

Figure 3:
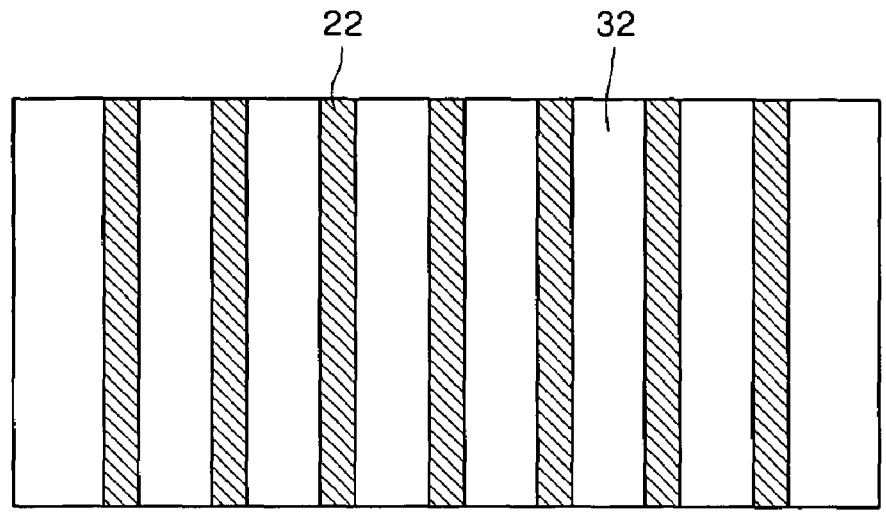
FIGS. 3 to 7 are schematic plan views of a substrate of for an optical element of the present invention.
Figure 4:
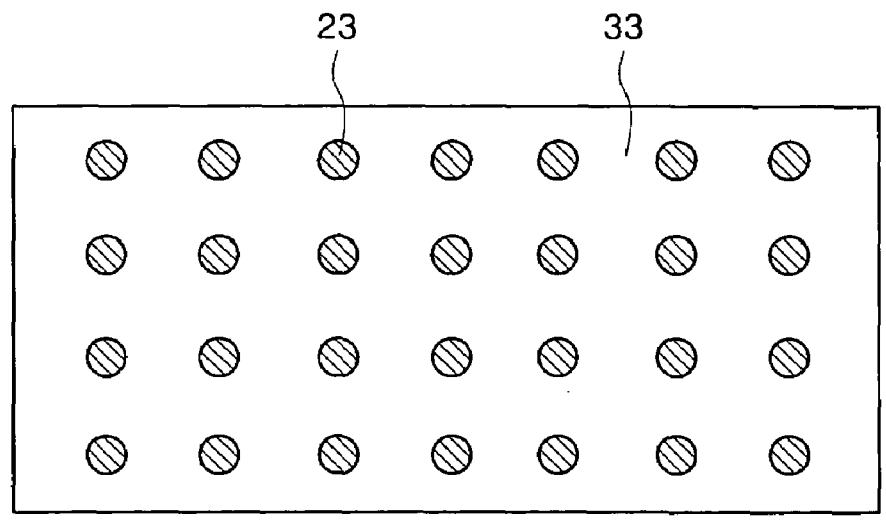
Figure 5:
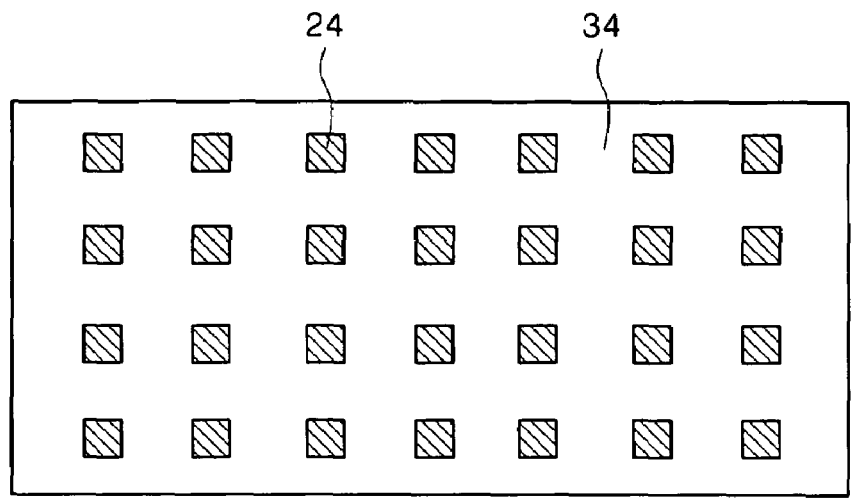

Referring to FIG. 3, the configuration of the light scattering unit that scatters the visible light used in the present invention will now be described. The configuration of the light scattering units can be a stripe type 22 shown in FIG. 3, a dot type 23, 24 shown in FIGS. 4 and 5, and a wall type 25, 26 shown in FIGS. 6 and 7. It is preferable that an area of a light scattering unit in the substrate surface is 0.5 to 60%, and more preferably, 5 to 30%. Further, the light scattering unit of the light transmissive substrate of the present invention scatters light, but does not block the light.

Figure 6:
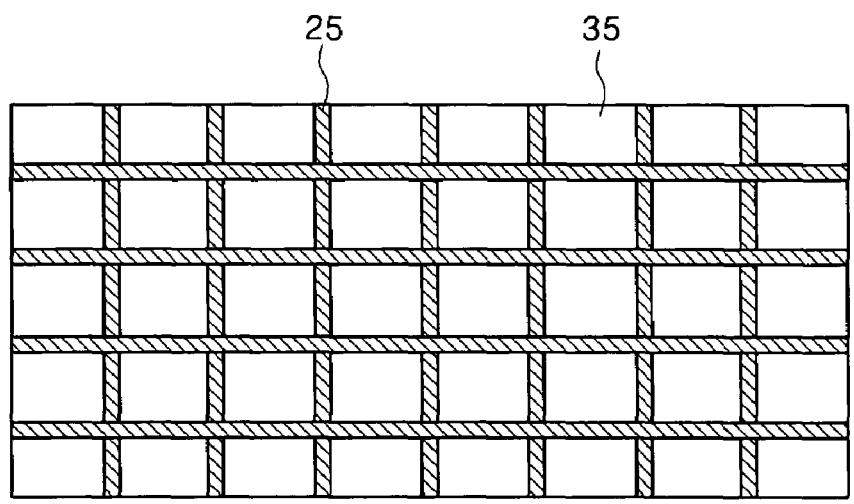
Figure 7:
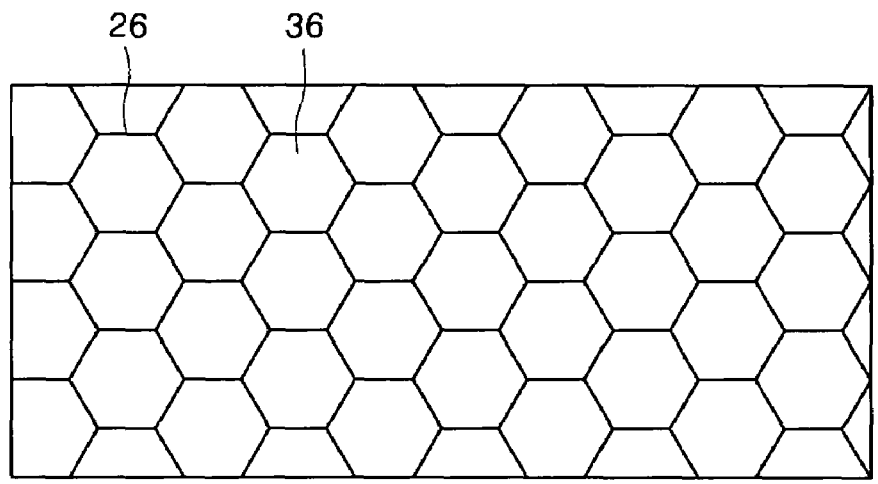

That is, when the light transmissive opening is formed in the light transmissive substrate, segmented by at least one light scattering unit, any pattern is acceptable. The specific configuration is not limited to the detailed examples illustrated in the embodiments. Particularly, as shown in FIGS. 3 or 6, it is preferable that the light scattering unit 22, 25 is extended (successively formed) in at least one direction within the display pixel. Further, the interval between the light scattering units and the ratio of the light scattering unit to the light transmissive opening can be arbitrarily set. FIG. 3 shows an example that the light scattering unit is extended in at least one direction within the display pixel. That is, the light scattering unit 22 is extended in one-axis direction. Further, FIG. 6 shows that the light scattering unit 25 is crossed in the extended one-axis direction. As shown in FIG. 6, a shape of one pixel segmented by being crossed in the display pixel can be formed in polygon (a rectangle: square (regular square, for example) or a regular polygon: regular pentagon, regular hexagon). Preferably, the segmented one pixel is formed segmented with the pixel adjacent to the wall structure. Preferably, for the substrate of the present invention, this segmented pixel (or its group) has a period in the direction of substrate surface as shown in FIGS. 3, 6 and 7. Further, as described above, while this period can be arbitrarily set, it is preferable that, when the length is a reference, the sum 42 of the thickness of the segmented wall and the width of one adjacent light transmissive opening is 130 nm to 25 μm. Further, there can be a plurality of periods within the substrate surface. The periods can vary according to a place or a direction of the substrate surface. Preferably, the width of the light transmissive opening is 100 nm to 20 μm, and more preferably, 100 nm to 10 μm.

Figure 8:
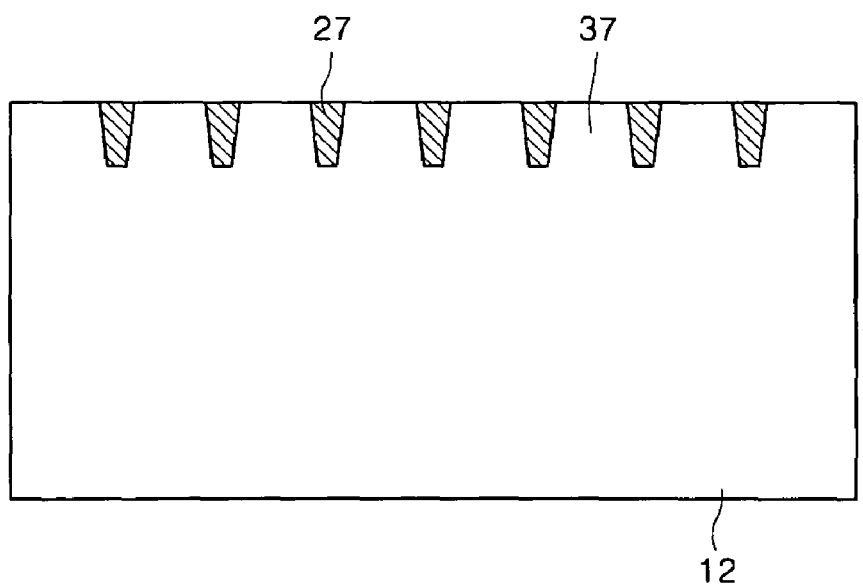
FIGS. 8 to 11 are schematic cross-sectional views of a substrate for an optical element of the present invention.
Figure 9:
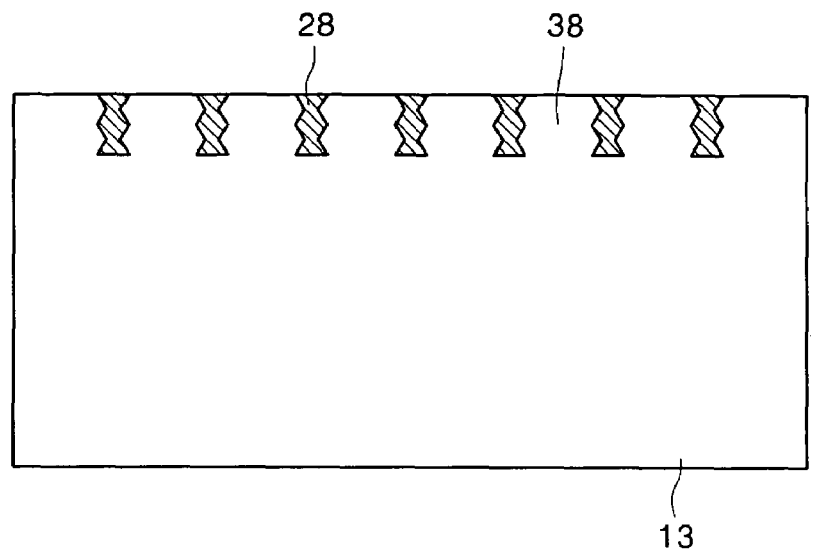
Figure 10:
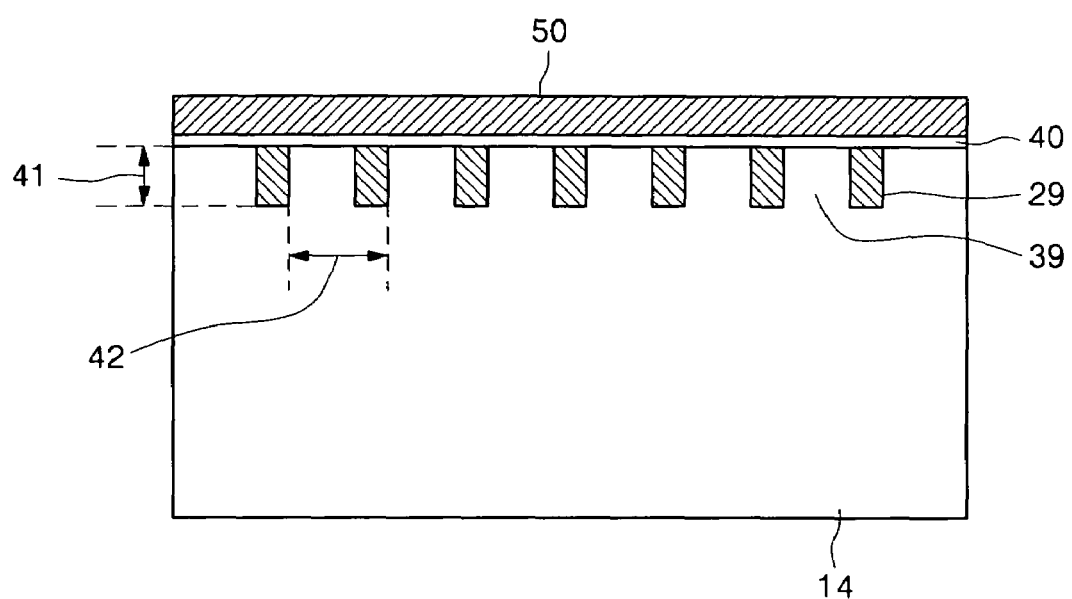

Further, a shape of the light scattering unit can be arbitrarily set according to the material employed in the light transmissive substrate or the light scattering unit. That is, as shown in FIG. 8, the surface of the light scattering unit 27 in the depth direction does not necessarily need to be formed vertically, so that it can have a sloped surface against the light transparent substrate surface, which is approximately flat. Further, as shown in FIG. 9, an interface between the light scattering unit 28 and the light transparent substrate 13 does not necessarily need to be flat, so that it can be uneven (prominence and depression). At this case, the unevenness can be formed to attribute to the scattering. For example, the unevenness can be formed in this surface with dry etching method that uses atom-shaped boron formed by discharge or with wet etching method that uses etchant, such as HF, where those etching methods are used in manufacturing a semiconductor. Further, the light transmissive substrate of the present invention can be formed with planarization layer 40 coating as shown in FIG. 10, when used in the organic electroluminescence element. Here, it is preferable that the interval between the anode 50 and the light scattering layer 29 is as small as possible, so that the thickness of the planarization layer 40 is below 100 nm, preferably.

Figure 11:
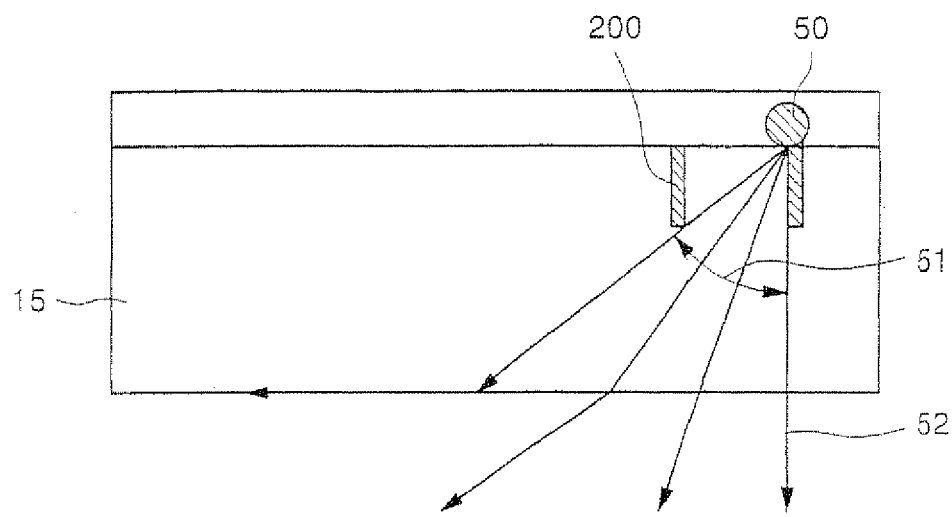

The length in the thickness direction of the light transparent substrate of the light scattering unit (in the normal direction of the substrate surface) can be arbitrarily set. To improve the light extraction efficiency of such an organic electroluminescence element, the length in the thickness direction of the substrate of the light scattering unit 200 can be set so as to scatter the exit light 52 having an angle more than a critical angle 51 of the interface between the light transmissive substrate 15 and air as shown in FIG. 11, for example. At this case, the critical angle 51 depends on the refractive index of air and that of the light transmissive substrate 15, and their relationship can be represented as θc=arc sin(n1/n2), where n1 and n2 indicate the refractive index of air and that of the light transmissive substrate 15, respectively. Further, it is preferable that they have a relationship expressed as W/L≦tan(arc sin(n1/n2)) in Eq. 1, where "L" indicates the thickness 41 (length in the substrate direction), and "W" indicates the size of the light transparent opening (light transmissive opening). Further, in FIGS. 8 and 9, "L" indicates the length in the thickness direction of the substrate of the light scattering units 27 and 28 and "W" indicates the width of the light transmissive openings 37 and 38. Further, a height of the light scattering unit, which is required for scattering the exit light having an angle more than the critical angle 51, can be set to the distance from the substrate surface of the light transparent substrate to the light-emitting center. Particularly, as shown in FIGS. 1, 8 and 9, it is preferable that one side of the light scattering units 20, 27, 28 is a surface (cross-sectional surface) of the light transparent substrate 10, 12, 13.

When the organic electroluminescence element is formed on the substrate for the optical element of the present invention, it is preferable that the light scattering unit is buried within the light transparent substrate or that the end of the light scattering unit has the same position as the surface of the light transparent substrate, in order to obtain the substrate flatness.

A method of manufacturing the substrate for the optical element comprising the light scattering unit and the light transparent unit used herein will be further described. As this method, there can be employed a method of forming a groove in the substrate and then burying light scattering material in the groove, or a method of depositing the light scattering material on the substrate and then covering it with the light transparent material (for forming the light transmissive opening).

When the method of forming the groove in the pattern shape is employed as the method of forming the groove, the known method, for example, the conventional exposure process using photoresist, can be used. Further, various photolithography processes can be used as a method of forming the groove in the pattern shape.

Figure 12:
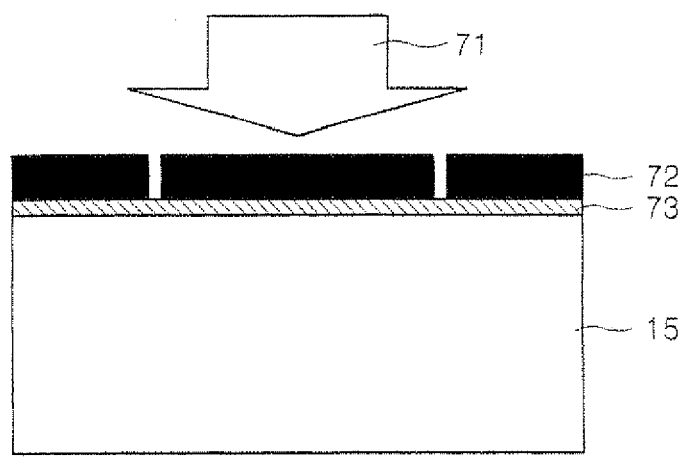
FIG. 12 is a schematic cross-sectional view of a substrate, illustrating one process of manufacturing the substrate for an optical element of the present invention.

FIG. 12 shows an exposure process 71 using a mask 72 and photoresist material 73 when forming such a groove. The exposure process using the mask 72 can arbitrarily design the ratio of a pitch or line to a space (groove, width, and groove interval) of a target groove.

Figure 13:
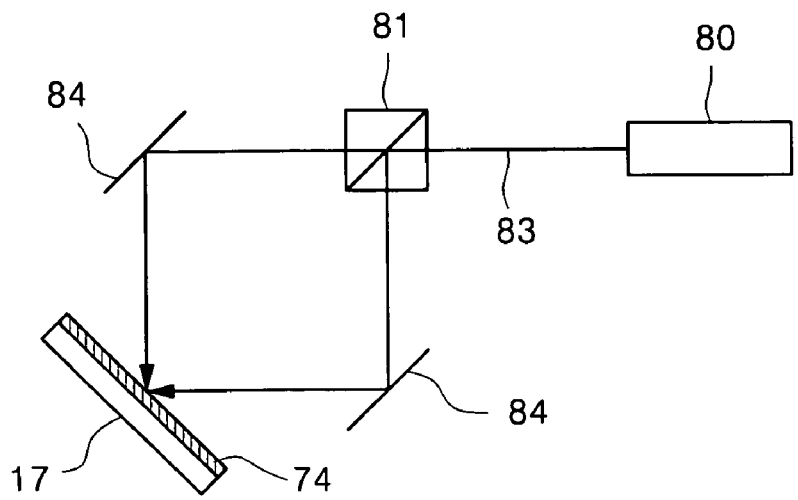
FIG. 13 is a schematic view illustrating a process of manufacturing a substrate for an optical element of the present invention.

FIG. 13 is an example of forming a groove with a two-optical-flux interference exposure process of laser. It is possible for the two-optical-flux interference exposure process of the laser to perform exposure of a large area in a short time, and is especially effective to form the light scattering unit in the periodic configuration. For this method, the pitch d of the periodic configuration has the following relationship: $d=(\lambda/2)/[\sin(\theta/2)]$, where "λ" indicates a laser wavelength used in this exposure, and "θ" indicates a crossing angle of the 2 light flux of the laser for irradiating a photoresist material 74 on the substrate. As θ gets larger, d becomes smaller, and when the crossing angle is 180°, d becomes λ/2 of the minimum value. For example, when a laser of 488 nm (λ) is irradiated using an argon-ion laser, d) 244 nm. That is, the pitch can be simply set with any value more than 244 nm, by simply adjusting the crossing angle.

The laser light 83 employed in the two-optical-flux interference exposure process randomly uses a light source 80, though not limited, such as solid laser, gas laser, semiconductor laser, and color laser, etc. to appropriately set the value d. In the two-optical-flux interference exposure process, laser light 83 is divided into two light fluxes by a beam splitter 81, and the two light fluxes are reflected by mirrors 84 to strike a photoresist material 74.

When used in forming the diffraction grating included in the organic electroluminescence element, it is preferable to use the laser light source in the same range of wavelength as the visible light. For this, the light source 80 for use in this process is, for example, a YAG laser, a YAG laser multiple wave, a YAG laser triple wave, a color laser, a HE-Ne laser, a Ar ion laser, a Kr ion laser, a Cu vapor laser, a He—Cd laser, and N2 laser, etc.

Figure 14:
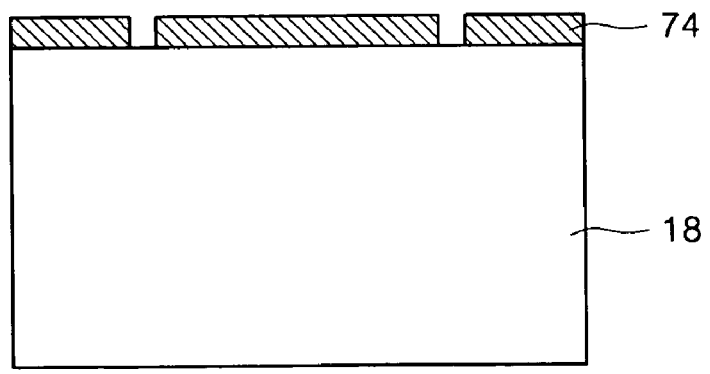
FIG. 14 is a schematic cross-sectional view of a process of manufacturing a substrate for an optical element of the present invention.
Figure 15:
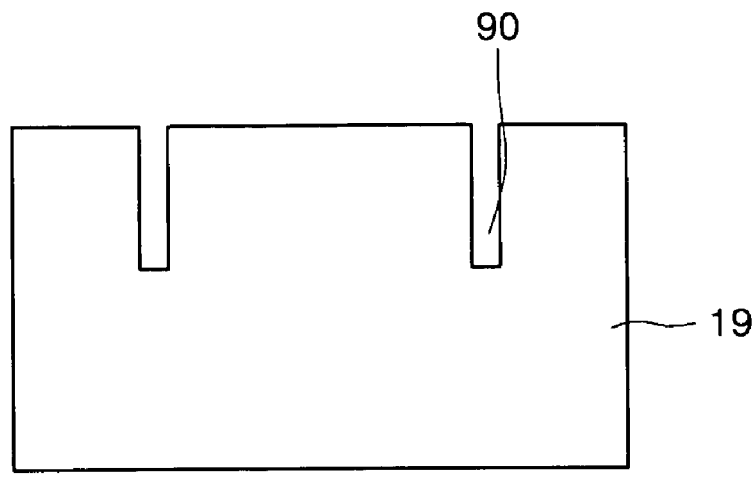
FIGS. 15 and 16 are schematic views illustrating a process of manufacturing a substrate for an optical element of the present invention.

The photoresist material for use in forming patterns can be appropriate selected among a positive type resist material, and a negative type resist material and the like. After forming the pattern in the photoresist material 74 as shown in FIG. 14, an etching process is performed to get a groove 90 in substrate 19, as shown in FIG. 15. This etching process can be selected among the known methods, such as wet etching, reactive ion etching, and ion milling, in order to form the groove.

Figure 16:
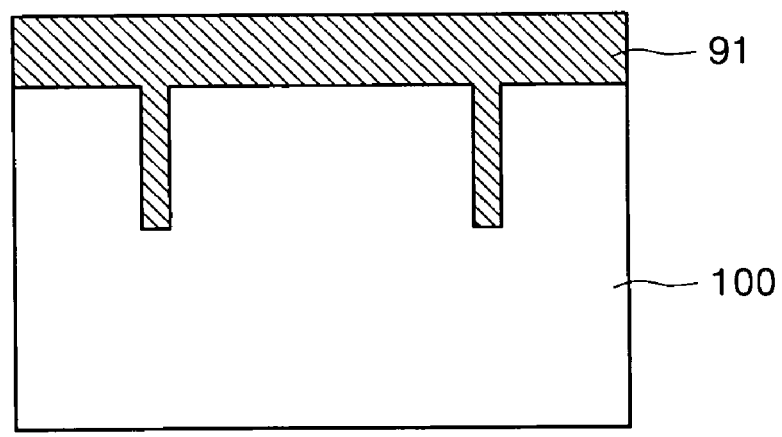

Subsequently, a method of filling the groove 90 with the light scattering material 91 will now be described. For this method, there can be employed either a wet process, such as a sol-gel process, or a vacuum process, such as sputtering, deposition or CVD process. Here, the light scattering material 91 can be filled only in the groove 90, and after forming a layer with the light scattering material 91 all over the substrate 100 surface as shown in FIG. 16, the light scattering material 91 formed on the light transmissive portion by a polishing process (e.g. CMP process) can be removed. The light scattering material 91 can use a mixture that has different refractive index materials. The mixture can be either a solid/air mixture, such as a porous $SiO_2$ layer, or a solid/solid mixture, such as a $SiO_2/TiO_2$ (the mixture can have a layer shape) layer. Meanwhile, when the wall of the groove 90 is uneven, the light scattering material 91 is not necessarily needed, and when filled, a solid material is preferable as a filling material. However, gas, such as nitrogen, or liquid is also available, and it is preferable to have scattering characteristics.

Figure 17:
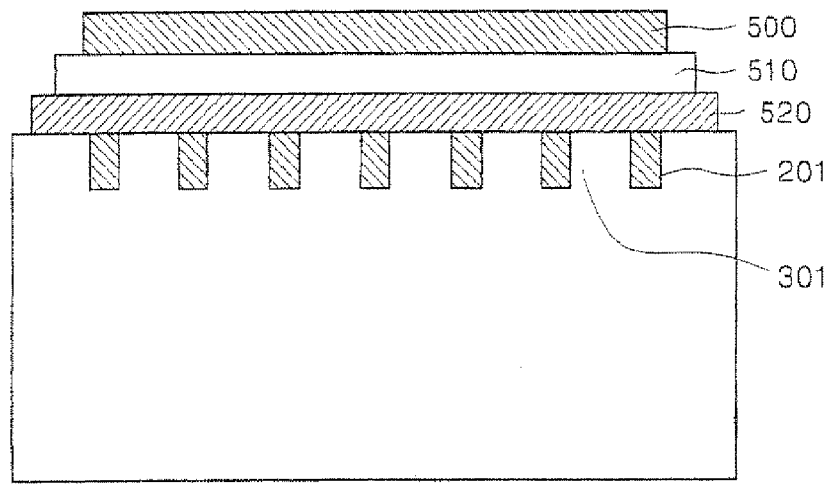
FIGS. 17 and 18 are schematic cross-sectional views of an organic electroluminescence element using a substrate for an optical element of the present invention.
Figure 18:
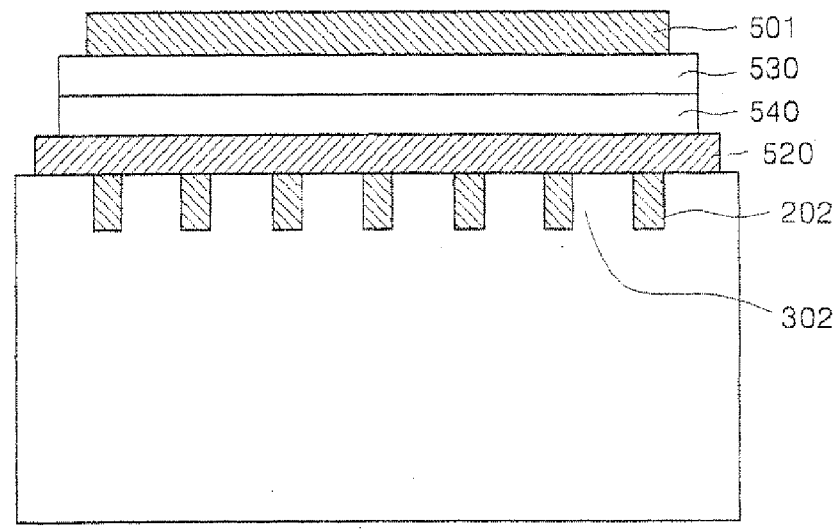

The organic electroluminescence element of the present invention comprises a substrate for an optical element, an anode, an organic layer made of at least emission layer, and a cathode. As a specific example of the device configuration of the organic electroluminescence element according to the present invention, FIGS. 17 and 18 show that organic layers 510, 530, 540 are stacked either one layer or stacked layer more than two layers between electrodes 520, 500, 501. For example, there can be employed anode/emission layer/cathode configuration, anode/hole transport layer/emission layer/electron transport layer/cathode configuration, anode/hole transport layer/emission layer/cathode configuration, and anode/emission layer/electron transport layer/cathode configuration. Further, the organic electroluminescence element of the present invention can be either a small molecular type or a high molecular type.

The hole transport material used in the present invention is not specifically limited, and thus, if it is typically used as the hole transport material, any compound is acceptable. As a specific example of the hole transport material, there can be employed a triphenyl diamine group or a starburst molecule type, such as bis(di(P-trile)aminophenyl-1,1-cyclohexan, N—N'-diphenyl-N—N'-bis(3-methylphenyl)-1-1'-biphenyl-4-4'-diamine, N—N'diphenyl-N—N-bis(1-naphthyl)-1,1'-biphenyl)-4-4'-diamine.

The electron transports material used in the present invention is not specifically limited, and thus, if it is typically used as the electron transport material, any compound is acceptable. As a specific example of the electron transport material, there can be employed oxadiazol derivatives, triazol derivatives, quinolinol metal complex, such as 2-(4-biphenyl)-5-4(t-buthylphenyl)-1,3,4-oxadiazol, bis{2-(4-t-buthylphenyl)-1,3,4-oxadiazol}-m-phenylene.

The light-emitting material used in the present invention is not specifically limited, and thus, if it is typically used as the light-emitting material, any compound is acceptable. As a specific example of the light-emitting material, there can be employed distyryl-arylene derivatives (Japanese Patent Application Laid-Open Nos. H2-247278 and H5-17765), coumarin derivatives, dicyano-methylene-pyran derivatives and perylene derivatives (Japanese Patent Application No. S68-264692), aromatic ring system material (Japanese Patent Application Laid-Open Nos. H8-298186 and H9-268284), anthracene group (Japanese Patent Application Laid-Open Nos. H9-157643, H9-268283, and H10-72581), and quinacridone derivatives (Japanese Patent Application Laid-Open No. H5-70773).

The anode of the organic electroluminescence plays a role injecting holes into the hole transport layer, and is effective that it has above 4.5 eV work function. A specific example of anode material used in the present invention is ITO, NESA, gold, silver, platinum, and copper, etc. Further, the cathode is to inject electrons into electron transport band or emission layer, preferably, it is a low work function material. The cathode material is not particularly limited, and specifically, there can be used In, Al, Mg, Mg—In alloy, Mg—Al alloy, Al—Li alloy, Al—Sc—Li alloy, and Mg—Ag alloy, etc. Further, the organic electroluminescence element of the present invention can be used for passive drive, and for active drive by adding an active element, such as thin film transistors TFT. A method of forming each layer of the organic electroluminescence element of the present invention is not particularly limited, and can be selected among the known methods. For example, there can be employed vacuum deposition, molecular bean etching (MBE), or a method of dipping solvent or dispersion into solution or emulsion, spin coating, casting, bar coating, and roll coating.

Further, the organic electroluminescence display device of the present invention comprises a plurality of organic electroluminescence elements. The method of driving this display device can be either an active type or a passive type, and not particularly limited.

Figure 19:
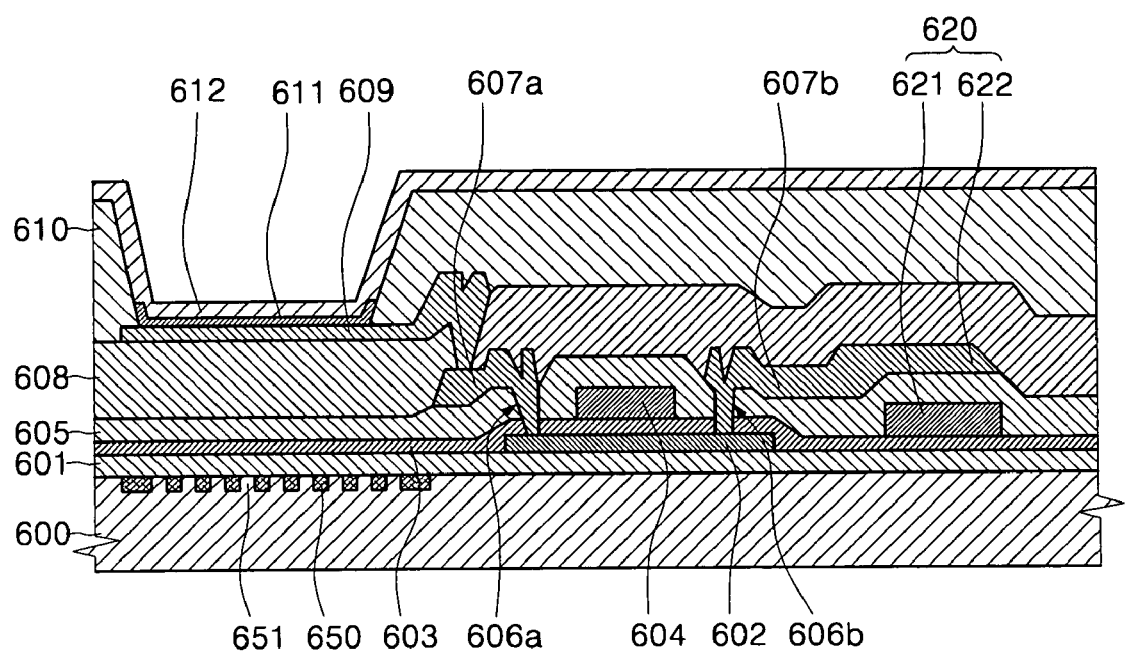
FIGS. 19 to 21 are schematic cross-sectional views Illustrating examples of an active matrix organic electroluminescence display device that comprises a substrate for an optical element.
Figure 20:
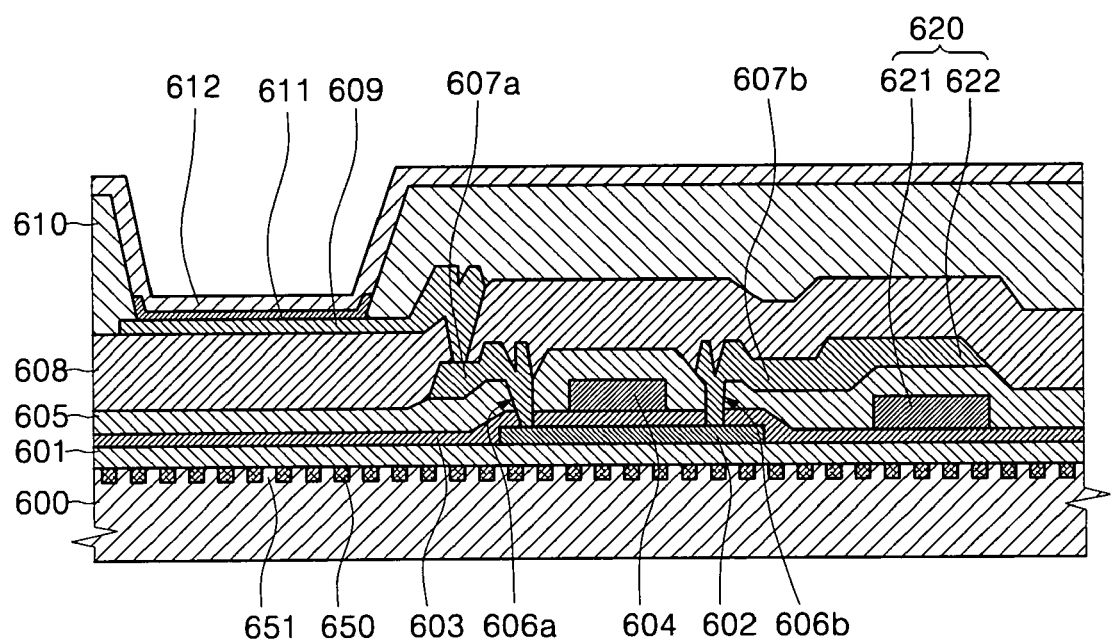
Figure 21:
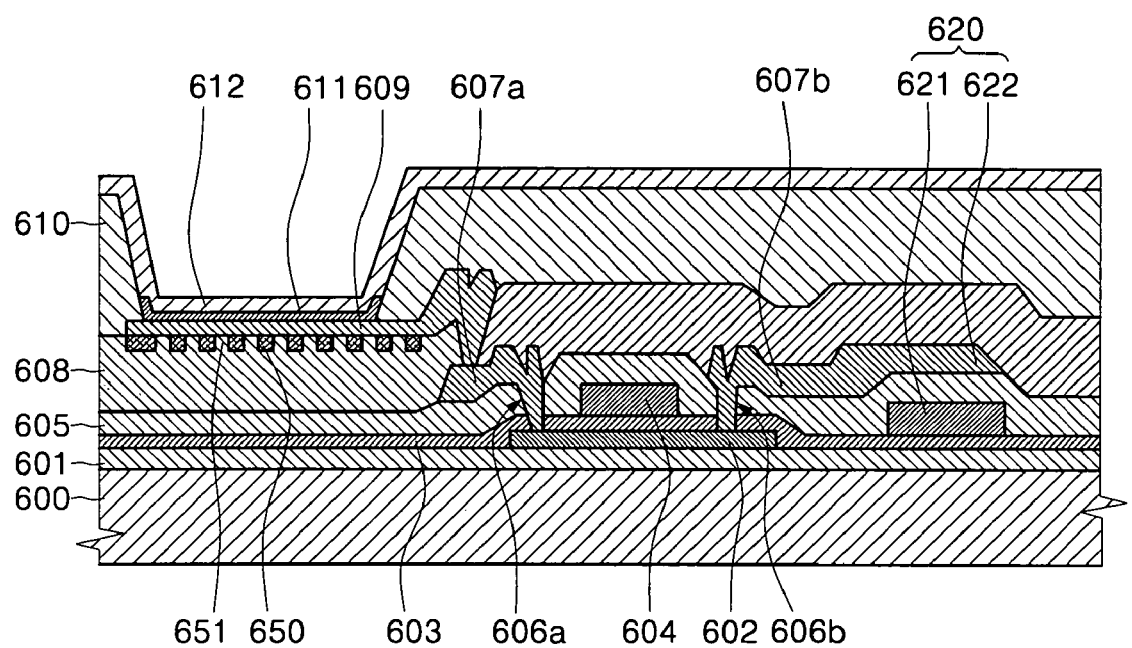

FIGS. 19 and 20 Illustrate examples of an active matrix organic electroluminescence display device that comprises a substrate for an optical element.

Referring to FIGS. 19 and 20, a light transparent substrate 600 having light emitting region and pixel driving circuit region is provided. A light scattering unit 650 and a light transmissive opening 651 may be formed in light emitting region of a light transparent substrate 600 as shown in FIG. 19. On the other hand, a light scattering unit 650 and a light transmissive opening 651 may be formed in light emitting region and pixel driving circuit region of a light transparent substrate 600 as shown in FIG. 20. The light scattering unit 650, the light transmissive opening 651 and the light transparent substrate 600 constitute a substrate for an optical element. A buffer layer 601 is formed on the substrate for an optical element. The substrate for an optical element has the same configuration as in the above-stated embodiment.

A TFT and a capacitor 620 are formed on the buffer layer 601 of the pixel driving circuit region. The TFT comprises n or p type semiconductor layer 602; a gate insulating film 603 burying the semiconductor layer 602; a gate electrode 604 corresponding to the semiconductor layer 602; a first insulating layer 605 burying the gate electrode 604; a drain electrode 607a and a source electrode 607b. The drain electrode 607a and the source electrode 607b are connected to both sides of the semiconductor layer 602 via contact holes 606a and 606b, respectively, wherein the contact holes 606a and 606b are formed in the first insulating layer 605 and the gate insulating film 603. The capacitor 620 has a lower electrode 621 buried by the first insulating layer 605 and a upper electrode 622 opposing to the lower electrode 621, wherein the upper electrode 622 is connected to the source electrode 607b and formed on the first insulating layer 605.

A second insulating layer 608 is formed on the first insulating layer 605. A first electrode layer 609 is formed on the second insulating layer 608 to electrically connect to the drain electrode 607a. A planarization film 610 having an opening exposing the first electrode layer 609 is formed. The opening is positioned on the light emitting region. An organic layer 611 is stacked on the first electrode layer 609. A second electrode layer 612 is formed on the organic layer 611 and the planarization film 610.

Meanwhile, in the bottom emitting organic electroluminescence display comprising the first electrode layer 609 formed of ITO being a transparent conductive material and comprising the light transparent substrate 600, the buffer layer 601, the gate insulting film 603, and the first and second insulating layers 605 and 608 each formed of a transparent material.

At this time, the position where the light scattering unit 650 and the light transmissive opening 651 is to be formed is not limited to those embodiments and may be between layers with high refractive index. For example, the light scattering unit 650 and the light transmissive opening 651 may be formed in light emitting region of a second insulating layer 608.

Examples of the present invention will now be described in more detail. However, the present invention is not limited to these examples, and the specific scope is described with reference to the other parts of detailed description and accompanying drawings. Further, in the example of the present invention, measurement of luminescence characteristics of the organic electroluminescence element is performed at a light-focusing angle of 0.1 degree using a photometer TOPCON BM-5A placed in the normal direction of the substrate.

EXAMPLE 1

A positive resist material was formed on the quartz substrate (refractive index: 1.457) in a thickness of 4000 µm using a spin coater, as a photoresist material, and then the resist material was patterned using a photomask.

As a light source, an Hg—Xe lamp (wavelength: 250 nm) was used. Here, a stripe type mask pattern was used with a period of 1.0 µm, a line width of 0.75 µm, and a space width of 0.25 µm. With this mask, after exposed one time, the mask was rotated 90°, and was exposed again with the same condition. After such exposure, the mask was processed with alkali developer to form the resist pattern. As a result of SEM observation, it was confirmed that a target grating pattern could be manufactured. The quartz substrate attached to the manufactured resist pattern was etched by reactive gas etching (Samuco, RIE1ONR). Etching was performed under the condition of 100 W output, using $CF_4$ (4 Pa, 20 SCCM). The etching was performed to make a groove of 10000 µm in the quartz substrate during 2080 seconds.

Subsequently, the formed groove was processed with dilute hydrofluoric acid, and the unevenness was formed in the groove. After removing the resist material with a remover, dispersion used in the sol-gel process, by which $TiO_2$ is formed, was applied to the formed groove, and the filling-up of $TiO_2$ was performed by the low temperature plastic sol-gel process. Subsequently, the substrate surface was flattened by polishing the substrate surface using the chemical-mechanical polishing (CMP) method. Measuring the flatness of the substrate surface, Ra was 2 nm. This substrate showed good scattering characteristics by $TiO_2$/quartz interface and $TiO_2$ itself. ITO was formed in a layer on the substrate using a sputtering process so that the sheet resistance becomes 20Ω/□. An ITO layer was 100 nm thick.

Subsequently, the following two layers were formed as an organic layer on the formed ITO. First, as a hole transport layer, N,N'-bis(3-methylpenyl)-N,N'-diphenyl-[1,1'-biphenyl]-4,4'-diamine was formed in a thickness of 50 nm using the vacuum deposition method, and then tris(8-quinolinol) aluminum was formed as the emission layer in a thickness of 70 nm using the vacuum deposition method. Next, Mg—Ag alloy was deposited as the cathode in a thickness of 150 nm, using the vacuum deposition method at a deposition speed ratio 9:1 (atom weight ratio) to manufacture the organic electroluminescence element. The luminous area was 41 µm.

When a current of 5 $mA/cm^2$ was applied to this manufactured device, a luminance of 275 cd/µm was obtained. It was confirmed that the luminous efficiency was improved compared to the organic EL device of the first comparative embodiment.

COMPARATIVE EXAMPLE

Except for not having the light scattering unit, an organic electroluminescence element was manufactured identical to that of the first example. When a current of 5 $mA/cm^2$ was applied to this device, a luminance of 190 $cd/m^2$ was obtained.

EXAMPLE 2

A positive resist material was formed on the quartz substrate (refractive index: 1.457) in a thickness of 4000□ by a spin coater, as a photoresist material, and then the formed photoresist layer was exposed by two-optical-flux laser interference exposure system. As a laser light source used in this two-optical-flux laser interference exposure, an Ar-ion laser (wavelength: 488 nm) was employed to make exposure under the following conditions.

Laser light was branched into 2 light flux with a beam splitter, and interference exposure was performed with a mirror such that a crossing angle becomes about 31 degree on the substrate surface (laser illumination intensity: 100 mA/µm, exposure time: 15 seconds). After such exposure was performed one time, the substrate was rotated 90° and exposed again with the same condition.

After exposure, it was processed by alkali developer AZ300MIF (manufactured by Clariant Japan Co.) to form the grating pattern. As a result of SEM observation, the periodic structure in about 475 nm was obtained. A ratio of a line to a space (ratio of pattern interval to pattern width) was almost 3 to 1. The quartz substrate attached to the manufactured resist pattern was etched using the reactive gas etching (Samuco, RIE-1ONR) process. The etching was performed under the condition of 100 W output, using $CF_4$ (4 Pa, 20 SCCM). The groove was etched to 5000□ in the quartz substrate during 1040 seconds. Subsequently, the formed groove was processed by dilute hydrofluoric acid, and the unevenness was formed in the groove. Next, the resist material was removed by a remover. Further, by the sol-gel process, the groove is filled up and flattened using $TiO_2$ porous layer. Subsequently, $TiO_2$ was polished by the CMP process. By this polishing, the periodic structure of $TiO_2$ can be manufactured on the quartz substrate. Measuring the flatness of the substrate surface under the same conditions as the first example, Ra was 2 nm. This substrate shows slight scattering characteristics through $TiO_2$/quartz interface and $TiO_2$ itself. ITO is formed in a layer on the substrate using a sputtering process so that the sheet resistance becomes 20Ω/□. An ITO layer was 100 nm thick.

Subsequently, two layers were formed as an organic layer on the formed ITO. First, as a hole transport layer, N,N'-bis(3-methylpenyl)-N,N'-diphenyl-[1,1'-biphenyl]-4,4'-diamine was formed in a thickness of 50 nm using the vacuum deposition method, and then tris(8-quinolinolat)aluminum was formed as the emission layer in a thickness of 70 nm using the vacuum deposition method. Next, Mg—Ag alloy was deposited as the cathode in a thickness of 150 nm, using the vacuum deposition method at a deposition speed ratio 9:1 to manufacture the organic electroluminescence element. The luminous area was 4 $mm^2$. When a current of 5 mA/µm was applied to this device, a luminance of 275 cd/μm was obtained. As described above, according to the substrate of the present invention, the luminance in the front direction of the substrate is improved, and the organic electroluminescence having good visibility can be provided.

What is claimed is:

1. A substrate for an optical element, comprising
a light scattering unit that scatters visible light, and a light transmissive opening that transmits the visible light in a light transparent substrate transmitting the visible light;
wherein a length L of the light scattering unit in a thickness direction of the substrate and a width W of the light transmissive opening is found by the following equation:

$$W/L \leq \tan(\arcsin(n1/n2))$$

where n1 indicates a refractive index of air and n2 indicates a refractive index of the light transparent substrate.

2. The substrate according to claim 1, wherein a surface of the light scattering unit has the same surface as the light transparent substrate.

3. The substrate according to claim 1, wherein the light transmissive opening is formed in the light transparent substrate, by being segmented by at least the light scattering unit, and wherein the light transmissive opening is periodically placed in a direction of the substrate surface.

4. The substrate according to claim 1, wherein the substrate for the optical element forms at least one display pixel, and the light scattering unit extends in at least one direction in the display pixel.

5. The substrate according to claim 4, wherein the light scattering unit is a wall structure that segments the display pixel.

6. The substrate according to claim 5, wherein the light transmissive opening segmented by the wall type structure is periodically placed in the direction of the substrate surface.

7. The substrate according to claim 1, wherein the width W of the light transmissive opening is 100 nm to 20 μm.

8. The substrate according to claim 3, wherein the light transmissive opening is periodically placed in the direction of the substrate surface, and the sum of the thickness of the segmenting wall and the width of one light transmissive opening adjacent to the segmenting wall is 130 nm to 25 μm.

9. An organic electroluminescence element, comprising the substrate for an optical element of claim 1, an anode, an organic layer made of at least an emission layer, and a cathode.

10. An organic electroluminescence display comprising a plurality of the organic electroluminescence elements of claim 9.

* * * * *